(12) United States Patent
Thomas et al.

(10) Patent No.: US 8,141,822 B2
(45) Date of Patent: Mar. 27, 2012

(54) AUTOPHAGOUS MULTIFUNCTION STRUCTURE-POWER SYSTEM

(76) Inventors: James P. Thomas, Alexandria, VA (US); Jared N. Baucom, Alexandria, VA (US); William R. Pogue, III, Easton, MD (US); Siddiq M. Qidwai, Annandale, VA (US)

( * ) Notice: Subject to any disclaimer, the term of this patent is extended or adjusted under 35 U.S.C. 154(b) by 4 days.

(21) Appl. No.: 11/217,851

(22) Filed: Sep. 1, 2005

(65) Prior Publication Data
US 2011/0127373 A1 Jun. 2, 2011

Related U.S. Application Data

(60) Provisional application No. 60/610,865, filed on Sep. 1, 2004.

(51) Int. Cl.
*B64D 37/02* (2006.01)
(52) U.S. Cl. ................... 244/135 R; 244/135 B
(58) Field of Classification Search ............... 244/135 R
See application file for complete search history.

(56) References Cited

U.S. PATENT DOCUMENTS

| | | | | |
|---|---|---|---|---|
| 5,467,889 A | * | 11/1995 | Ashton et al. | 220/562 |
| 5,816,539 A | * | 10/1998 | Chan et al. | 244/159.4 |
| 6,047,923 A | * | 4/2000 | Lafferty | 244/15 |
| 6,491,255 B1 | * | 12/2002 | Bracken et al. | 244/135 R |
| 6,691,621 B2 | | 2/2004 | Pierrot et al. | |
| 6,904,749 B2 | | 6/2005 | Joshi et al. | |
| 7,137,597 B2 | * | 11/2006 | Schuster et al. | 244/135 A |
| 7,357,149 B2 | * | 4/2008 | Howe | 137/399 |

OTHER PUBLICATIONS

Qidwai, M. A. J. Thomas, and P.Matic, "Structure-battery multifunctional composite design", Proc. SPIE Int. Soc. Opt. Eng. 4698, 180 (2002).
Baucom, J. N., Thomas, J. P., Pogue, W. R. III, and Qidwai, M. A., "Autophagous Structure-Power Systems," Proc. SPIE Int. Soc. Opt. Eng. 5387, 96 (2004).
Qidwai, M. A., Thomas, J. P., Kellogg, J. C., and Baucom, J., "Energy Harvesting Concepts for Small Electric Unmanned Systems," Proc. SPIE Int. Soc. Opt. Eng. 5387, 84 (2004).
Rodriguez, J. F., Thomas, J. P., and Renaud, J. E., "Design of Fused-Deposition ABS Components for Stiffness and Strength," Jour. of Mech. Design, 125(3), p. 545-551 (2003).
Thomas, J. P., "A Classical Representation for a Mass Based Chemical-Potential," International Journal of Engineering Science, 31(9), p. 1279-1294 (1993).
Thomas, J. P., "The Modeling of Open Mass Continuum Mixtures," International Journal of Engineering Science, 29(11), p. 1451-1469 (1991).

(Continued)

*Primary Examiner* — Joshua J Michener
*Assistant Examiner* — Medhat Badawi
(74) *Attorney, Agent, or Firm* — Amy L. Ressing; Sally A. Ferrett

(57) ABSTRACT

A vehicle including at least one bladder for containing a two-phase liquid-gas fuel at a predetermined pressure, with a bladder outlet arranged to releasing vapor fuel from the bladder. The fuel provides energy for propulsion of the vehicle, and the vapor pressure of the fuel provides initial structural integrity of the vehicle, by rigidizing and stiffening the beam assembly to resist inward buckling until the liquid fuel is expended. In an exemplary embodiment, the vehicle is an unmanned aerial vehicle. A combustion chamber and thermoelectric conversion module can generate electricity for a propeller and battery.

15 Claims, 8 Drawing Sheets

OTHER PUBLICATIONS

Thomas, J. P. And Qidwai, M. A., "The Design and Application of Multifunctional Structure-Battery Materials Systems," Jom, 57(3), p. 18-24 (2005).

Thomas, J. P. and Qidwai, M. A., "Mechanical Design and Performance of Composite Multifunctional Materials," Acta Materialia, 52(8), p. 2155-2164 (2004).

Thomas, J. P., Qidwai, M. A., Matic, P., Everett, R. K., Gozdz, A. S., Keennon, M. T., and Grasmeyer, J. M., "Structure-Power Multifunctional Materials for UAV's," Proc. SPIE Int. Soc. Opt. Eng. 4698, 160 (2002).

\* cited by examiner

AUTOPHAGOUS MULTIFUNCTION STRUCTURE-POWER SYSTEM

CROSS REFERENCE TO RELATED APPLICATIONS

This application is a non-provisional application under 35 USC 119(e) of, and claims the benefit of, provisional application 60/610,865, filed in the United States on Sep. 1, 2004, the entire disclosure of which is incorporated by reference herein.

FIELD OF THE INVENTION

This invention relates generally to a class of multifunctional material systems that can provide both mechanical/structural support and energy for use by components, devices, vehicles, or systems having both mechanical structure and energy containment, and more particularly to a vehicle including a multifunctional material which serves as both fuel and structural support.

DESCRIPTION OF RELATED ART

Typical unmanned air vehicles use separate, single-function structural and power components. Structural elements of unmanned air vehicles often include a fuselage, wings with one or more spars, ribs, and covering skin, an empennage (tail) structure, and vertical and horizontal control surfaces. For vehicles powered by internal combustion or gas turbine engines, liquid fuel is typically used. The weight of liquid fuel can be used to lower the mechanical stresses occurring in the wings by appropriately distributing the fuel within the wing.

U.S. Pat. No. 6,904,749 to Joshi et al. discloses multifunctional material for use as fuel and structure, including a polyoxymethylene for structural support member and propellant of an aircraft.

Multifunctional materials are described in: Muhammad A. Qidwai, James Thomas, and Peter Matic, "Structure-battery multifunctional composite design," Proc. SPIE Int. Soc. Opt. Eng. 4698, 180 (2002); Thomas, J. P., Qidwai, M. A., Matic, P., Everett, R. K., Gozdz, A. S., Keennon, M. T., and Grasmeyer, J. M., "Structure-Power Multifunctional Materials for UAV's," Proc. SPIE Int. Soc. Opt. Eng. 4698, 160 (2002); Baucom, J. N., Thomas, J. P., Pogue, W. R. III, and Qidwai, M. A., "Autophagous Structure-Power Systems," Proc. SPIE Int. Soc. Opt. Eng. 5387, 96 (2004); Qidwai, M. A., Thomas, J. P., Kellogg, J. C., and Baucom, J., "Energy Harvesting Concepts for Small Electric Unmanned Systems," Proc. SPIE Int. Soc. Opt. Eng. 5387, 84 (2004); Thomas, J. P. and Qidwai, M. A., "The Design and Application of Multifunctional Structure-Battery Materials Systems," JOM, 57(3), 18-24 (2005); and Thomas, J. P. and Qidwai, M. A., "Mechanical Design and Performance of Composite Multifunctional Materials," Acta Materialia, 52(8), 2155-2164 (2004).

BRIEF SUMMARY OF THE INVENTION

The system and methods described herein can improve the performance of a device, vehicle, or system with mechanical structure and energy storage/containment parts by increasing the amount of energy that can be carried by the device/vehicle/system while maintaining the overall system weight, or by decreasing the overall weight via reduction in structural weight while maintaining the total amount of energy that can be carried by the device/structure/vehicle. The fuel performs a structure function, which eliminates the need for some passive structure. In the process of providing useable energy to the system, structural components "self consumed" are autophageous.

One embodiment of the invention is directed to an unmanned aerial vehicle with a multifunctional autophageous fuel that provides an increased fuel weight fraction, a smaller structural weight fraction and maintains the overall system weight and structural performance capability.

In one embodiment, a lightweight flexible polymer composite cage in the form of a long, hollow cylindrical beam contains a polymeric bladder that holds a two-phase liquid-gaseous hydrocarbon fuel. The vapor pressure of the fuel expands the bladder and maintains an expanded cross-section for the composite cage maximizing its second area moment of inertia, which thereby provides the beam with enhanced bending stiffness and bend-buckling strength. The structure function performed by the fuel is maintained until all of the liquid fuel has been consumed. The two-phase fuel serves as a central core material for the composite beam, eliminating the need for and the weight of a standard structural composite core for the beam. In addition, the fuel is now carried within the composite beam, thereby eliminating the weight of a stand-alone fuel tank. The embodiment has been designed particularly to serve as a wing spar for an unmanned air vehicle.

DETAILED DESCRIPTION OF THE INVENTION

Figure 1:
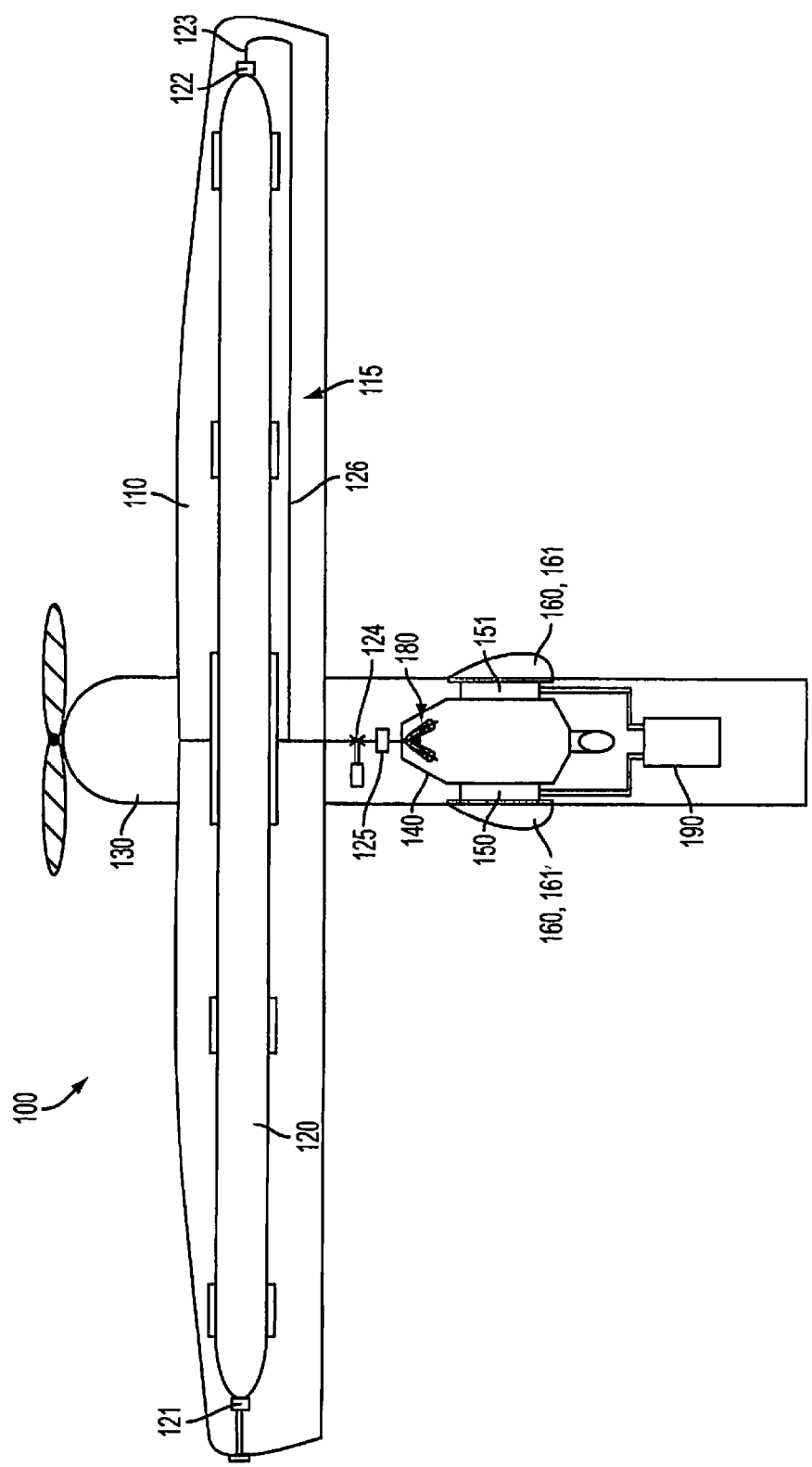
FIG. 1 illustrates an air vehicle in accordance with an embodiment of the invention.

The foregoing and other features and advantages of the invention will be apparent from the following, more particular, description of preferred embodiments of the invention, as illustrated in the accompanying drawings in which like reference characters refer to the same parts throughout the different views. The drawings are not necessarily to scale, emphasis instead being placed upon illustrating the principles of the invention.

An embodiment of the invention provides for a vehicle having at least one fuel bladder for containing a pressurized liquid-gaseous fuel, the fuel providing structural support and energy for propulsion or other needs of an unmanned air vehicle.

As used herein, a "fuel" is a material that is able to be employed to provide energy for the production of thrust or propulsive forces via electric motors, internal combustion engines, gas turbine engines, etc., or for any other energetic needs of the vehicle system other than thrust/propulsion.

FIG. 1 is a cross section of an air vehicle 100 according to an embodiment of the invention. The vehicle 100 includes one or more wings 110, shown here as two wings attached to a fuselage 130, although it is also suitable to configure the aircraft as a flying wing-type vehicle with a single wing acting as the fuselage.

A combustion chamber/thermoelectric conversion unit 140 within the fuselage 130 generates heat through combustion of fuel. In a preferred embodiment, combustion chamber/thermoelectric conversion unit 140 includes a combustion chamber 145 formed of a conductive material that transfers heat to a surrounding thermoelectric modules 150 and 151 that are preferably in direct contact with the conductive wall of the combustion chamber 145. As the fuel is combusted, heat is generated in the combustion chamber 145, heating the walls of the combustion chamber. Heat is exchanged between the combustion chamber walls and the thermoelectric modules 150 and 151.

Electrical power generated by the thermoelectric modules 150, 151 is transferred to a power conditioner 190. Conditioned power from the power conditioner drives the propeller or other thrust generating device and can provide electrical power to any other subsystems on the air vehicle that require electrical power (e.g., charging batteries, powering avionics, etc.).

While the power conditioner is preferred, power from the thermoelectric modules 150 and 151 can also directly drive electrical systems of the air vehicle or can provide electrical power to a battery (not shown).

The conductive material that forms the wall or walls of the combustion chamber can be copper or another material with a high heat transfer coefficient. One or more heat sinks 160, 161 can be adjacent to the thermoelectric modules 150 and 151 to receive unconverted heat from the thermoelectric modules. The heat sinks 160, 161 can include one or more ribs or fins that extend through the fuselage 130 to better dissipate heat to the atmosphere.

A nozzle 180 with an ignition element directs the fuel into the combustion chamber and ignites the fuel-oxygen mixture. In a preferred embodiment, oxygen for combustion is supplied through an air intake. Alternatively, oxygen can be provided from an oxygen tank (not shown) or other source.

Fuel is stored in the wings 110 of the vehicle 100 in a multifunctional autophagous fuel-structure spar 120. The spar 120 can be a long, hollow cylindrical beam that includes a polymeric fuel bladder that holds pressurized hydrocarbon liquid-gas fuel. Prior to flight, fuel is introduced into the spar through a fuel inlet 121 that can be located at an end of one wing or at another location on the wing. Fuel exits the spar through a fuel outlet 122 located at an opposite end of the wing, or at another location on the wing.

Fuel in gaseous form flows from the spar 120 to the combustion chamber/thermoelectric conversion unit 140 through a flow control system 115. The flow control system 115 can include a bladder interface 123, a remotely actuated on/off flow control valve 124, tubing 126, and an optional pressure-reduction orifice 125. All of the component materials for the flow control system 115 are preferably chemically compatible with the selected fuel. The tubing 126 is preferably rated for the fuel vapor pressures and expected operating temperatures. The flow control valve 124 may be servo-actuated or a latching solenoid type. The optional pressure-reduction orifice 125 can be included to allow the pressure to be reduced to a desired fuel pressure at the burner, if the desired fuel pressure is less than the vapor pressure.

Figure 2:
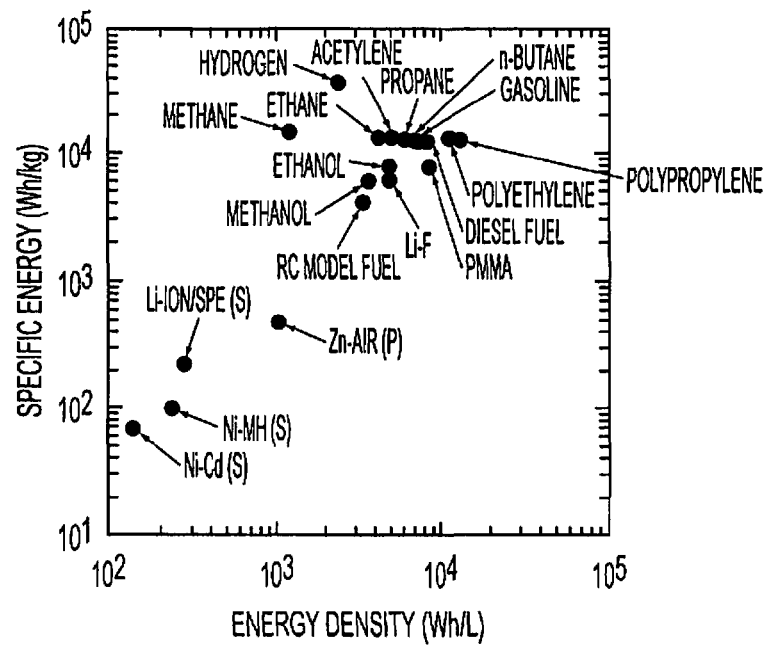
FIG. 2 is a graph of specific energy (energy per unit mass) versus energy density (energy per unit density) for some fuels, some of which are suitable for use in embodiments of the invention.
Figure 3:
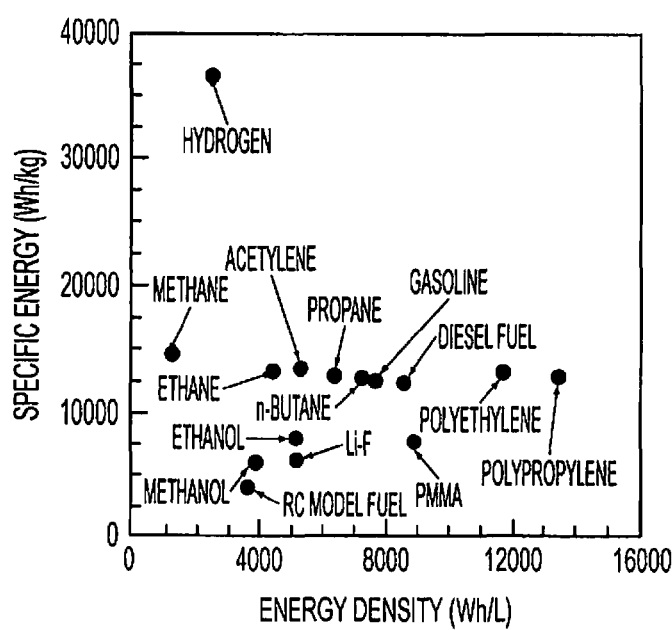
FIG. 3 is an expanded view of a portion of FIG. 2.

FIG. 2 and FIG. 3 are graphs showing the specific energy and energy density available in Watt-hours per kilogram (Wh/kg) and Watt-hours per liter (Wh/L) for different substances with a capacity for storing energy that are suitable for fuel or for batteries. Substances existing as two-phase liquid-gas fuels at room temperature include propane and n-butane, and at much higher equilibrium pressures, acetylene, hydrogen, ethane, and methane. Substances existing as a liquid-phase fuel at room temperature include ethanol, methanol, gasoline, diesel fuel, and RC model fuel. Substances existing as a solid-phase fuel at room temperature include polypropylene, polyethylene, and PMMA. Electrochemical materials suitable for use in batteries include Ni—Cd (S), Ni-MH-S, Li-Ion/SPE (S), and Zn-Air (P).

Figure 4:
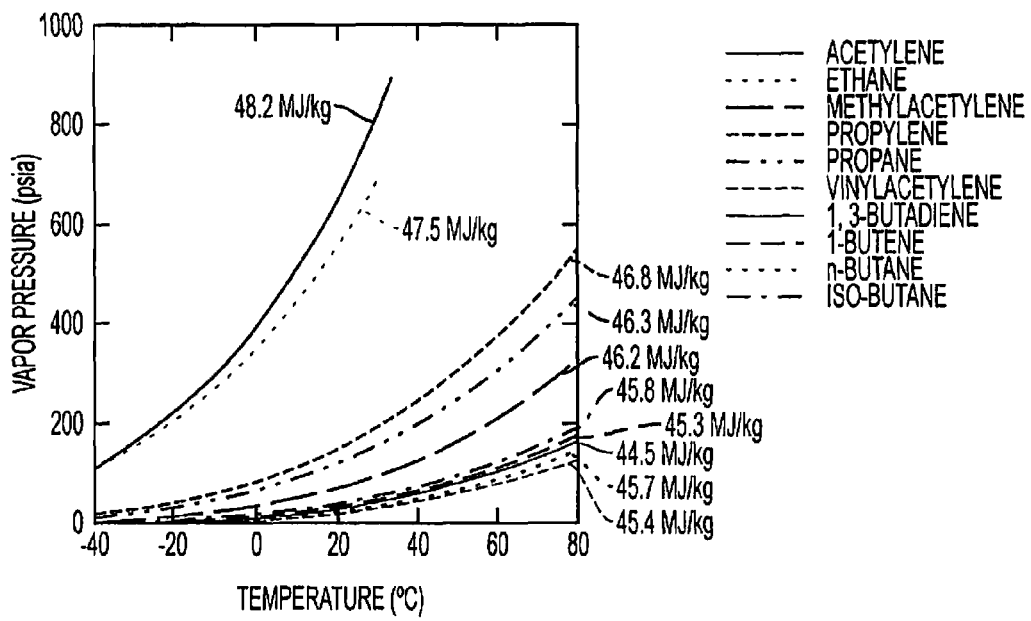
FIG. 4 is a graph of vapor pressure versus temperature for some hydrocarbon fuels exhibiting a two-phase liquid-gas equilibrium state that are suitable for use in embodiments of the invention compared to other fuels.
Figure 5:
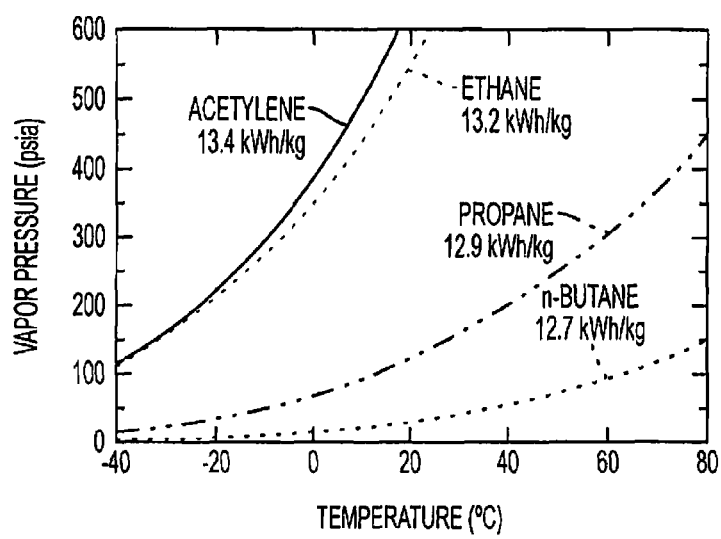
FIG. 5 is an expanded view of a portion of FIG. 4.

FIGS. 4 and 5 illustrate the vapor pressure versus temperature for various materials suitable as liquid-gas fuels, including acetylene, ethane, methylacetylene, propylene, propane, vinylacetylene, 1,3 Butadiene, 1-Butene, n-Butane, and iso-Butane.

The fuel used in the vehicle 100 can be any suitable two-phase liquid-gaseous hydrocarbon fuel at the operational temperature, including but not limited to the fuels shown in FIGS. 2 through 5. In a preferred embodiment, the fuel includes n-butane or propane. N-butane and propane have high heats of combustion, a wide range of vapor pressures, and burn cleanly. The fuels can be used in pure form or as a mixture depending on the operational requirements. For example, fuel mixtures can be formulated to provide a desired vapor pressure at an expected operating temperature.

An amount of fuel is added to the fuel bladder and the bladder is sealed, with the amount of fuel sufficient to maintain the fuel in a liquid-gas state at a desired vapor pressure for an expected operational temperature. The vapor pressure causes the fuel and bladder to exert outward force on a lightweight support structure, adding structural support to the vehicle for takeoff and flight. As fuel exits the bladder to provide energy for vehicle power, the liquid fuel evaporates to maintain the vapor pressure in the bladder, maintaining a substantially constant pressure until the liquid portion of the fuel is expended.

For pure substances and their mixtures, the vapor pressure (in equilibrium with the liquid phase) is a function of temperature, as seen in FIGS. 4 and 5. The fuel-bladder system described herein uses this thermodynamic characteristic to maintain substantially constant internal pressure within the spar bladder during consumption of the fuel. This maintains a constant level of structure function until all of the liquid fuel has vaporized.

In one embodiment, the fuel is n-butane, which achieves a fuel vapor pressure of approximately 35 psia at room temperature.

Figure 6:
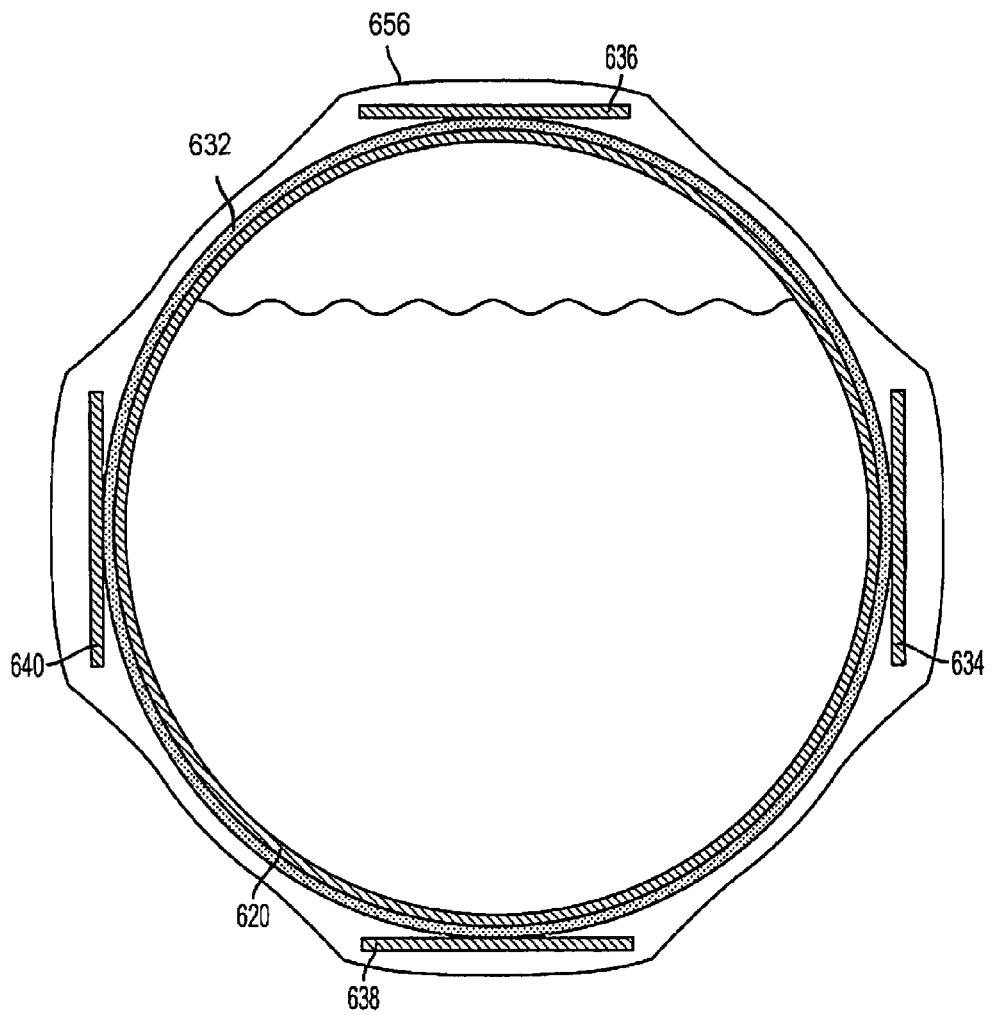
FIGS. 6, 7A and 7B illustrate autophageous multifunctional fuel-structure spars according to embodiments of the invention.
Figure 7A:
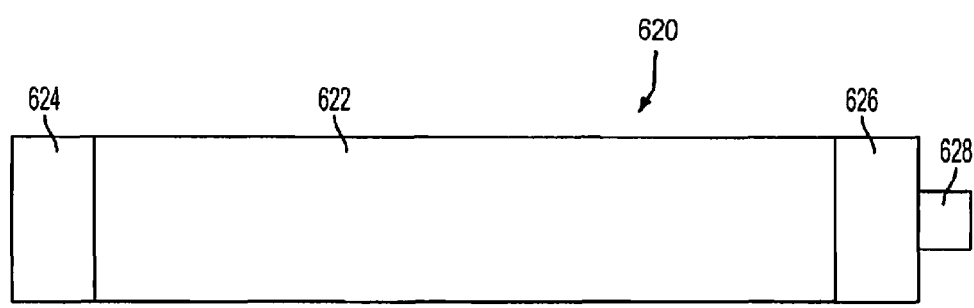
Figure 7B:
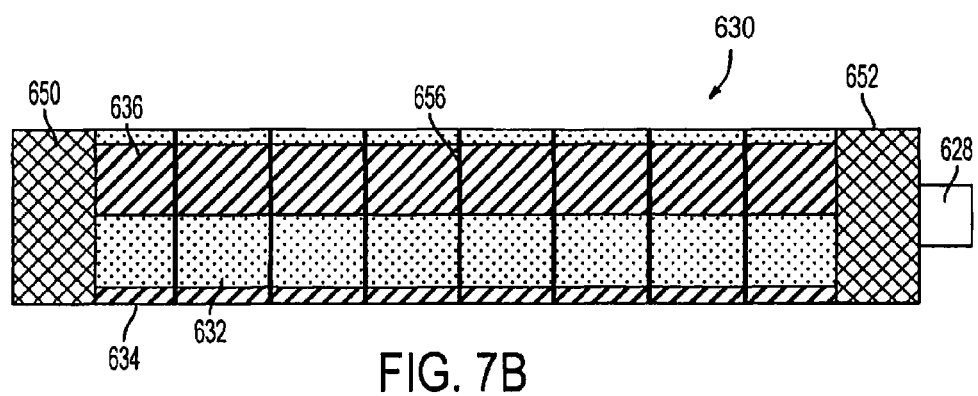

As illustrated in FIGS. 6, 7A, and 7B, the spar 120 includes a support structure that provides support to the fuel bladder 620. The fuel bladder 620 can comprise a thin-film polymer bladder that is chemically compatible with the selected fuel and impervious or substantially impervious to diffusion by the fuel vapor.

The support structure can be a composite cage that substantially encompasses the fuel bladder 620.

As seen in FIG. 6, the fuel has both a liquid phase and a gaseous phase. In operation, the vapor pressure of the fuel expands the bladder against the support structure, pushing it outwards.

To prevent the bladder 620 from blistering through gaps in the spar cap/rib network, the bladder can be sheathed with a woven light-weight aramid fiber fabric, such as that commerically available under the tradename KEVLAR™ from Dupont, headquartered in Wilmington, Del., USA. In an exemplary embodiment, the bladder, sheath, and spar cap strips are bound circumferentially by a series of KEVLAR™ thread wraps, which provide hoop reinforcement and restrict outward buckling of the spar cap strips. The spar cap strips 634, 636, 638, and 640 are connected at each end by composite end caps 650, 652. When the bladder 620 is pressurized, the axial strips are put in tension and the overall beam assembly becomes significantly stiffer and resistant to inward local buckling of spar-caps. Although KEVLAR™ material is used in an exemplary embodiment, other low weight, high strength materials such as graphite epoxy materials are also suitable.

In an exemplary embodiment, the spar includes a tubular thin-film polymer (C-Lam) bladder 620, which can be purchased commercial from AeroTec Laboratories, headquartered in Ramsey, N.J., USA. The polymer bladder 620 is 0.75 inches in diameter and 18 inches in length. The bladder 620 is housed in a composite cage comprising a KEVLAR™ sheath with four thin strips of unaxial graphite epoxy laminate spar caps 634, 636, 638, and 640 bonded along the length of the spar (spar-caps) and multiple transverse "ribs" or hoops 656 formed by KEVLAR™ thread winding. The graphite-epoxy spar-caps 634, 636, 638, and 640 are attached lengthwise around the circumference of the spar and in an exemplary embodiment, are bonded at each end to the end caps 650, 652. The spar-caps can be equal in width or unequal in width, and can be sized for the expected mechanical load distribution on the spar. These spar-caps are the main load carrying component of the spar and are held at a fixed distance from the central axis by the pressurized bladder. The spar thus achieves a high-level of mechanical performance using small amounts of light-weight, high-modulus materials held rigid by the pressurized bladder.

In operation, the vapor pressure of the fuel expands the bladder 620 and maintains an expanded cross section for the cage maximizing its second moment of inertia, which thereby provides the beam with enhanced bending stiffness and buckling strength. The structure function performed by the fuel is maintained until all of the liquid fuel is consumed. The spar 120 serves two operational functions: structure and power. Structure function is maintained until all liquid fuel has vaporized and only gaseous fuel remains, after which the pressure drops as fuel consumption continues.

The fuel and its vapor serve as the core material for the composite beam, which eliminates the weight of the passive core material and the weight of a separate fuel containment vessel. Another advantage of this embodiment is that the weight of the support cage and bladder are less than the weight of a stand-alone fuel tank. The embodiment is particularly useful as a wing spar for an unmanned air vehicle, however, it has many other suitable vehicle, propulsion, and power generation applications.

Figure 9:
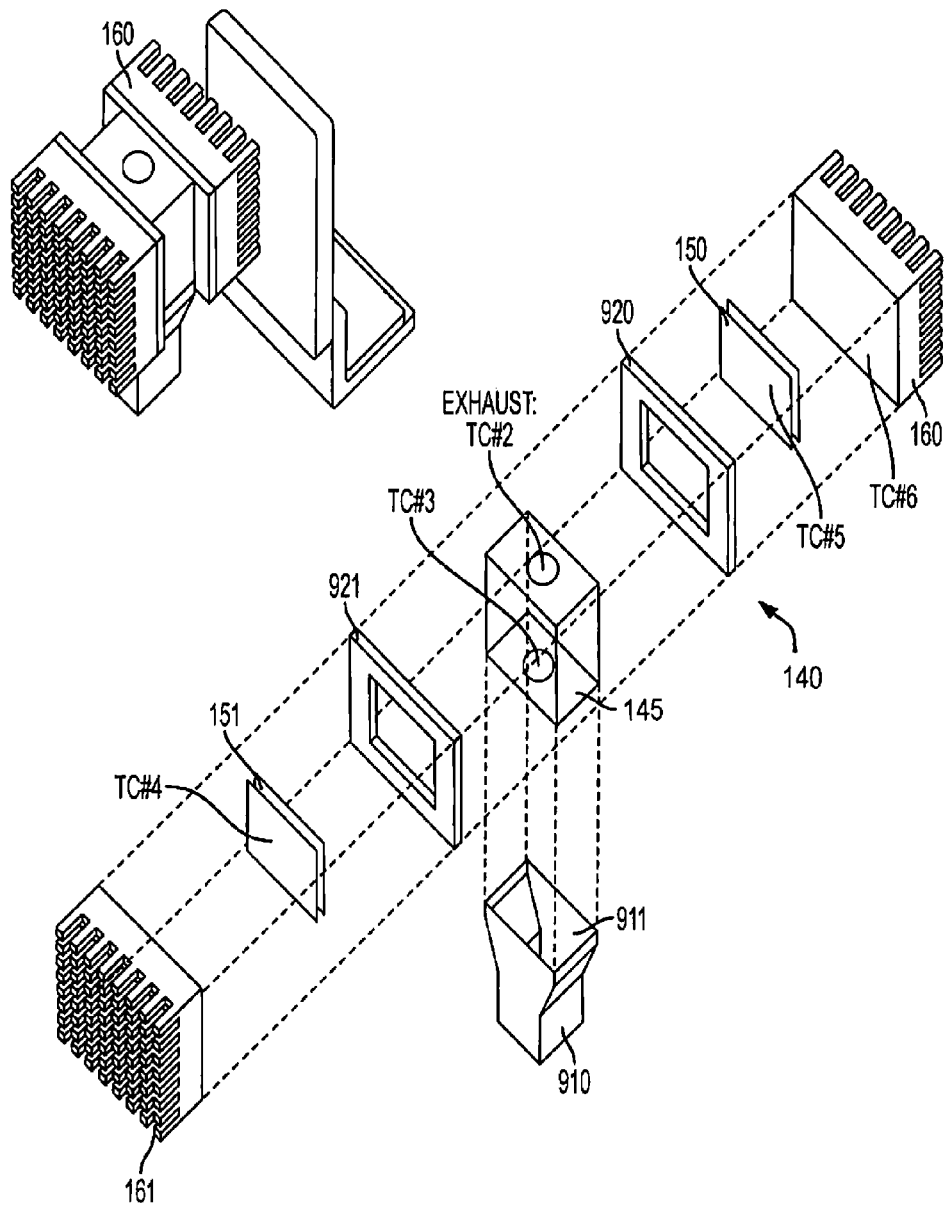
FIG. 9 illustrates schematically additional features of a combustion chamber and thermoelectric conversion unit suitable for use in converting hydrocarbon fuel to electric power in a vehicle according to an embodiment of the invention.

FIG. 9 illustrates an exemplary combustion chamber/thermoelectric conversion unit 140 in more detail, instrumented with thermocouples for laboratory measurements. The combustion chamber/thermoelectric conversion unit 140 includes a copper combustion chamber 145, an input plenum 910 for a flame with a first input thermocouple 911, polyimide frames 920 and 921 on opposite sides of the combustion chamber, thermoelectric modules 150 and 151, and aluminum heat sinks 160 and 161. Each heat sink 160, 161 extends through the fuselage 130 to dissipate heat to the atmosphere.

To initiate the power function, fuel flow is permitted by actuation of the flow control valve 124, followed by the triggering of an igniter at the mouth of a burner. This ignites a flame which sends combustion products through the combustion chamber 145. As the gases heat the chamber 145 to a steady state, the electrical power output of the thermoelectric modules 150, 151 reach a maximum. When the thermal conditions at the heat sinks remain constant and the electrical load remains constant, the thermoelectric output will also remain constant until all of the fuel is consumed. To maximize power output from the thermoelectric modules, the electrical load resistance can be matched with the modules in use.

Commercially available thermoelectric modules can be used. For example, two type CZ1-1.0-127-1.27HT thermoelectric modules manufactured by Tellurex, headquartered in Traverse City, Mich., USA, can be connected in series. For these modules, the required load resistance ranges between 1-20 ohms.

In an exemplary embodiment, fuel is initially ignited at the mouth of the burner nozzle by a spark, which may be generated by a charged capacitor, piezoelectric element, or other device. The combustion chamber 145 is preferably formed of a thermally conductive material with high internal surface area to maximize heat transfer from the products of combustion. The exterior of the combustion chamber is shaped and finished to provide maximum contact with minimal thermal resistance at the interface with the thermoelectric modules. Thermal grease may be used to improve thermal contact at interfaces between the combustion chamber 145 and the thermoelectric modules 150, 151, and other heat transfer interfaces, including the heat sink interfaces. Heat sinks 160, 161 with high surface area and low thermal resistance are placed on the other side of each module. Similarly, the shape and finish of the heat sinks are such that the thermal resistance at the heat sink to thermal module interface is minimized. Thermoelectric modules 150, 151 are chosen based on required power, voltage, current, and load characteristics. To further improve thermal contact, a clamping mechanism can be provided to clamp the components together to induce a pressure at the module interfaces and increase heat transfer. Air and exhaust porting provides adequate air intake and flame stability, as well as to duct hot exhaust gas away from the heat sinks. Insulation is applied to exposed areas of the combustion chamber to minimize radiative and convective heat loss from the chamber and direct heat transfer between the chamber and heat sinks.

The foregoing discussion concentrates on embodiments of a vehicle that include a combustion chamber for combusting hydrocarbon fuel. In embodiments of the invention, fuel can also directly provide propulsion through an internal combustion engine. Electrical power generated by the thermoelectric conversion module or an internal combustion engine can also be used to charge an on-board battery.

Figure 8:
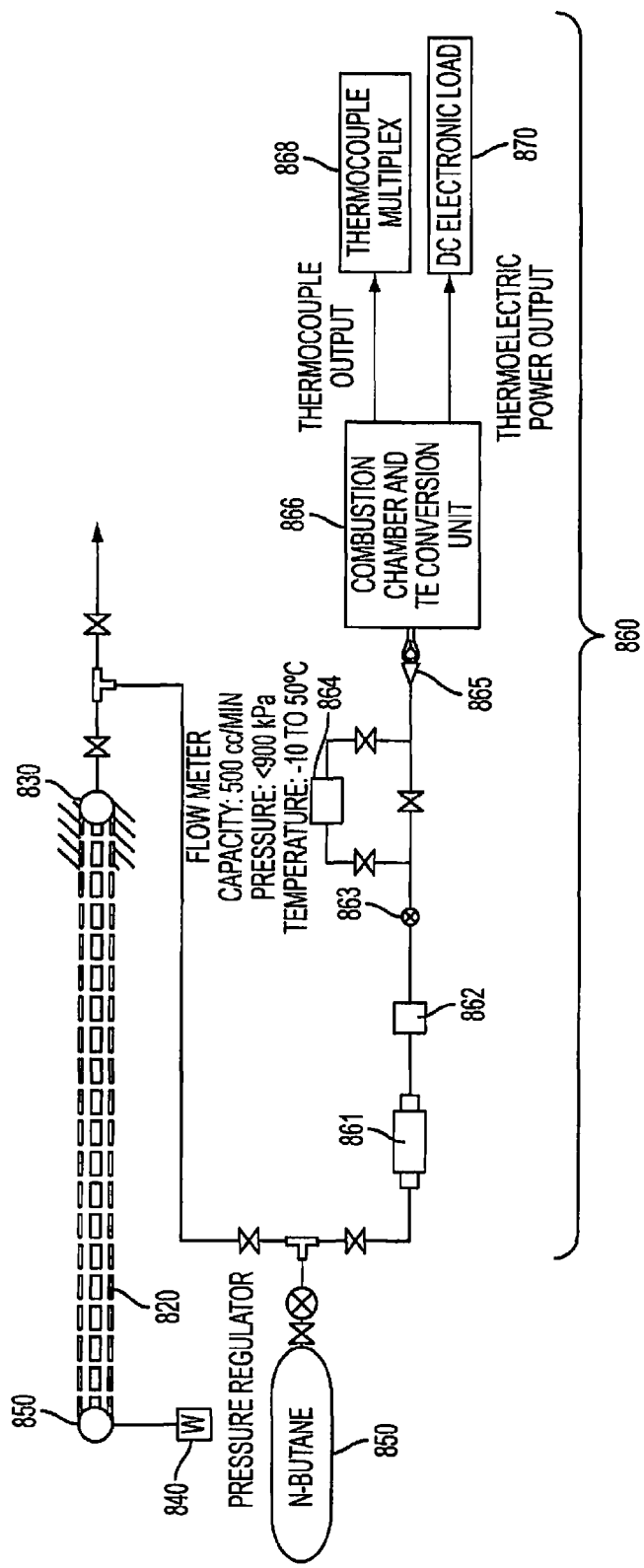
FIG. 8 illustrates a laboratory setup and prototype unit for demonstrating an autophageous multifunctional structure-energy system with thermoelectric conversion according to an embodiment of the invention.

FIG. 8 illustrates a laboratory setup and prototype unit for demonstrating a system according to an embodiment of the invention. A spar 820 is filled with pressurized nitrogen and n-butane and one end is fixed. The spar's length is approximately 46 centimeters and its width is approximately 1.9 cm. A weight 840 is applied to the unsupported far end 850 of the spar. Pressurized n-butane gas is provided to the combustion and thermoelectric conversion portion 860 of the prototype system. The nitrogen gas in the spar 820 is regulated to determine the mechanical characteristics of the spar, for example, the deflection versus load, stiffness, and maximum load for different test pressures.

The combustion and thermoelectric conversion subsystem 860 includes a flame arrestor 861, a filter 862, a needle valve 863, a flow meter 864, a nozzle, orifice and venturi unit 865, and the combustion chamber and thermoelectric conversion unit 866. The thermocouple output is directed to a thermocouple multiplex unit 868 and the thermoelectric power output is measured with a DC electronic load 870.

Figure 10:
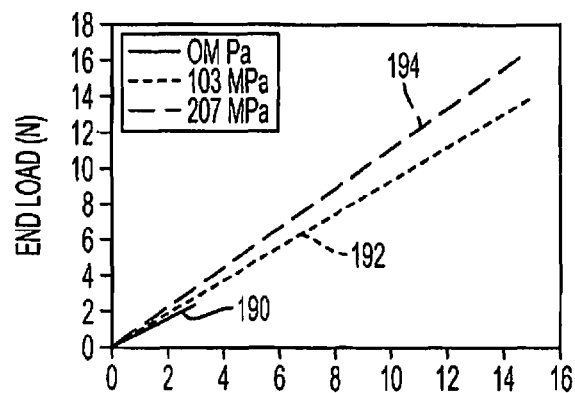
FIG. 10 illustrates deflection versus load for a cantilevered pressurized spar according to an embodiment of the invention.

FIG. 10 illustrates deflection versus load for a cantilevered pressurized spar 820 of FIG. 8 as a function of internal pressure (0, 15, and 30 psig) in which the internal pressure is supplied and controlled using regulated nitrogen gas. Curve 190 illustrates deflection versus load for an internal pressure of 0 psig, curve 192 illustrates deflection versus load for an internal pressure of 15 psig (103 kPa), and curve 194 illustrates deflection versus load for an internal pressure of 30 psig (207 kPa).

Figure 11:
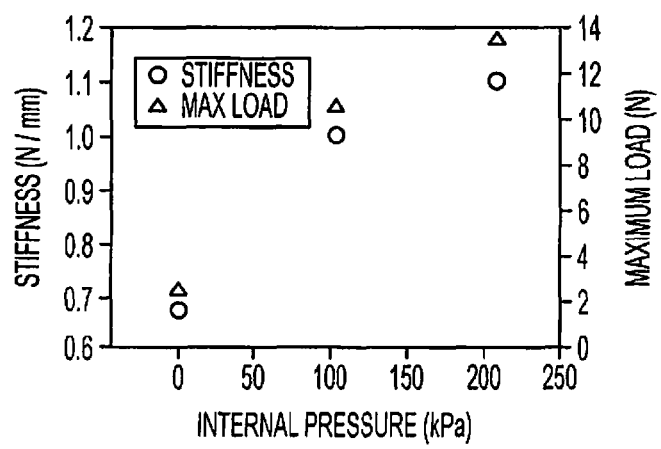
FIG. 11 is a graph illustrating the specific stiffness (stiffness per unit mass) and maximum load (maximum load per unit mass) for two prototype embodiments of the invention subjected to cantilever bending with an applied load.

FIG. 11 is a graph illustrating the improvement in mechanical performance of two prototype versions of a pressurized spar. The graph shows specific stiffness (stiffness per unit mass) and specific maximum load (maximum load per unit mass) for the two prototype embodiments of the invention (Prototype #1 weighing 48.1 grams empty and Prototype #2 weighing 42.1 grams empty) subjected to cantilever bending with an applied end-load. The pressurized spar shows a significant increase in stiffness (approximately 50% @ 15 psig) and a very significant increase in the failure load (approximately 450% @ 15 psig), which can be manifested by inward localized buckling of the lower (compressed) spar-cap.

Although not wishing to be bound by theory, the following equations are included to provide guidance on expected flight endurance for an electrically powered unmanned aerial vehicle with an autophagous multifunctional structure-power system as discussed in previous paragraphs and illustrated in FIG. 1.

The flight endurance time, $t_E$, of the unmanned aerial vehicle can be derived by consideration of force balance of the aircraft drag and thrust forces. The total flight endurance time is the sum of the homogeneous and particular solutions corresponding to the autophagous structure-power contribution and the battery contribution (accounting for the decrease in weight during flight). Autophagous structure-energy can provide longer flight endurance times of unmanned aerial vehicles than an equivalent (same specific energy) battery-only system due to the decrease in structure weight that comes with the use of autophagous multifunctional structure-energy components and the decrease in fuel weight during flight.

In particular, the power required for steady and level flight can be expressed as a function of the motor/propeller efficiency multiplied by the available battery plus available autophagous power:

$$\eta_{motor\&prop}\left(\frac{E_B \eta_B}{t_E} - \frac{1}{c_A}\frac{dW}{dt}\right) = \left(\frac{2C_D^2}{\rho_\infty S C_L^3}\right)^{1/2} W^{3/2}$$

This equation can be arranged as $$\frac{dW}{dt} + C_1 W^{3/2} = C_2 \text{ with } C_1 = \frac{c_A}{\eta_{motor\&prop}}\left(\frac{2C_D^2}{\rho_\infty S C_L^3}\right)^{1/2} \text{ and } C_2 = \frac{E_B \eta_B}{t_E}c_A.$$

A homogenous solution for the autophagous contribution to the flight endurance $t_E$ is $$t_E = \frac{2}{C_1}\left(\frac{1}{\sqrt{W_{total} - W_{Fuel}}} - \frac{1}{\sqrt{W_{Total}}}\right)$$

with the particular solution considering the battery contribution to the flight endurance being $$t_E + \int_{W(t_E)}^{\cdot} \frac{d\tau}{C_1 \tau^{3/2} - C_2} = Const.$$

The particular solution for $t_E$ shown is implicit. However, an explicit but complicated solution may be obtained. The above equations can be used for performing design analysis and sizing of autophagous structure-power components for unmanned air vehicles. In the absence of autophagous structure-power, the endurance time consists solely of the battery contribution with constant-weight conditions during flight, with the exact expression for $t_E$ being obtained by solving the governing differential equation for $t_E$ with $dW/dt$ set equal to zero.

In some embodiments, this invention provides a method of propelling a vehicle. In one example, the method includes releasing at least a portion of a pressurized gas-liquid fuel contained within a fuel bladder into a combustion chamber of a vehicle, the pressurized gas-liquid fuel being contained within a fuel bladder, the fuel and bladder providing initial structural support to the vehicle.

An advantage of the pressurized fuel bladder spar system described herein is that a non-fueled spar can be folded into a very low-volume configuration prior to filling with fuel, allowing compact storage prior to use. Another advantage is that autophagous structures such as the pressurized fuel bladder systems described herein are easily discarded after the fuel has been consumed.

In addition, the spar system and vehicle herein can provide additional energy storage capacity while maintaining the approximately the same overall weight and mechanical performance capability, yielding an increased flight time endurance. Alternatively, the spar system and vehicle can provide an identical energy storage capacity with lower structure plus fuel weight and the same mechanical performance capability resulting in increased payload capacity with the same flight endurance time. Moreover, the autophagous structure-fuel can provide longer flight endurance times than equivalent (same specific energy) battery systems due to the replacement of passive fuel with a multifunctional structure-fuel and the decrease in fuel weight during flight.

While this invention has been particularly shown and described with reference to preferred embodiments thereof, it will be understood by those skilled in the art that various changes in form and details may be made therein without departing from the scope of the invention encompassed by the appended claims.

The invention claimed is:

1. A vehicle comprising:
   at least one internal fuel bladder configured to contain a two-phase fuel in thermodynamic equilibrium at a temperature of operation;
   the bladder having an outlet configured to release the vapor fuel from the bladder and to supply the vapor fuel to a combustor to provide energy to the vehicle,
   the bladder configured to be pressurized by the vapor pressure of the fuel to at least 15 psi greater than ambient pressure; and
   the bladder being housed within a cage, the bladder and cage forming a beam assembly,
   wherein when bladder is filled with the fuel, the vapor pressure of the fuel rigidizes and stiffens the beam assembly to resist inward buckling of the cage until the liquid fuel is expended.

2. The vehicle according to claim 1, wherein the cage comprises:
   end caps located at each of two ends of the bladder; and
   a plurality of spar caps external to the bladder and extending longitudinally between the end caps.

3. The vehicle according to claim 1, further comprising a combustion chamber for combusting the fuel.

4. The vehicle according to claim 3, further comprising a thermoelectric converter for converting heat generated by the combustion chamber into electricity.

5. The vehicle according to claim 1, further comprising a remote controlled flow control valve.

6. The vehicle according to claim 1, wherein the fuel comprises butane or propane.

7. The vehicle according to claim 1, wherein the fuel consists essentially of butane.

8. The vehicle according to claim 1, wherein the fuel has an energy density of at least 3 kiloWatt hour per kg.

9. The vehicle according to claim 1, wherein the fuel has an energy density of at least 10 kiloWatt hour per kg.

10. The vehicle according to claim 1, further comprising a graphite epoxy sheath encompassing the bladder.

11. The vehicle according to claim 1, further comprising: a fabric sheath encompassing the bladder.

12. The vehicle according to claim 2, wherein the cage further includes a plurality of transversely extending ribs.

13. The vehicle according to claim 12, wherein the ribs comprise aramid fiber thread winding.

14. A method of propelling a vehicle, the vehicle having at least one internal fuel bladder containing a two-phase gaseous-liquid fuel in thermodynamic equilibrium at a temperature of operation, the bladder being housed within a cage, the cage and bladder forming a beam assembly, the method comprising:
   releasing vapor fuel from the bladder to supply the vapor fuel to a combustor;
   the bladder being pressurized by the vapor pressure of the fuel to at least 15 psi greater than ambient pressure, said vapor pressure rigidizing and stiffening the beam assembly to resist inward buckling of the cage until the liquid fuel is expended; and
   combusting the vapor fuel to produce energy.

15. The method according to claim 14, further comprising: generating electricity for propulsion by thermoelectric conversion of heat generated by said combusting the vapor fuel.

* * * * *